(12) United States Patent
Minamio

(10) Patent No.: US 7,511,367 B2
(45) Date of Patent: *Mar. 31, 2009

(54) OPTICAL DEVICE AND METHOD FOR FABRICATING THE SAME

(75) Inventor: Masanori Minamio, Osaka (JP)

(73) Assignee: Panasonic Corporation, Osaka (JP)

( * ) Notice: Subject to any disclaimer, the term of this patent is extended or adjusted under 35 U.S.C. 154(b) by 315 days.

This patent is subject to a terminal disclaimer.

(21) Appl. No.: 11/111,706

(22) Filed: Apr. 22, 2005

(65) Prior Publication Data

US 2005/0236685 A1 Oct. 27, 2005

(30) Foreign Application Priority Data

Apr. 26, 2004 (JP) .............................. 2004-130301

(51) Int. Cl.
*H01L 23/02* (2006.01)
(52) U.S. Cl. .................. 257/680; 257/777; 257/98; 257/100; 257/432; 257/434; 257/E25.032
(58) Field of Classification Search ................ 257/620, 257/680, 777, 98, 100, 432, 434, E25.032
See application file for complete search history.

(56) References Cited

U.S. PATENT DOCUMENTS

| 6,147,389 | A | 11/2000 | Stern et al. |
| 6,495,895 | B1 | 12/2002 | Peterson et al. |
| 6,621,616 | B1 | 9/2003 | Bauer et al. |
| 6,686,667 | B2 * | 2/2004 | Chen et al. ................. 257/787 |
| 6,713,857 | B1 * | 3/2004 | Tsai ........................... 257/686 |
| 7,166,907 | B2 | 1/2007 | Onishi et al. |
| 2003/0128442 | A1 | 7/2003 | Tanaka et al. |
| 2005/0105860 | A1 | 5/2005 | Oono et al. |
| 2005/0179102 | A1 | 8/2005 | Weiblen et al. |
| 2005/0253211 | A1 * | 11/2005 | Minamio et al. ............ 257/432 |

FOREIGN PATENT DOCUMENTS

| JP | 09055487 | * | 2/1997 |
| JP | 2000-58805 | A | 2/2000 |
| JP | 2002-043554 | A | 2/2002 |

OTHER PUBLICATIONS

Chinese Office Action, issued in Corresponding Chinese Patent Application No. 200510067365.7, dated on Aug. 3, 2007.

* cited by examiner

*Primary Examiner*—Lynne A Gurley
*Assistant Examiner*—Samuel A Gebremariam
(74) *Attorney, Agent, or Firm*—McDermott Will & Emery LLP

(57) ABSTRACT

An optical device includes: a base 10; an optical element chip 5 mounted on the base 10; an integrated circuit chip 50 bonded to the back surface of the optical element chip 5; and a transparent member (window member 6). An interconnect 12 is buried in the base 10. The interconnect 12 has an inner terminal portion 12*a*, an outer terminal portion 12*b* and an intermediate terminal portion 12*c*. Pad electrodes 5*b* on the optical element chip 5 are connected to the inner terminal portion 12*a* via bumps 8. Pad electrodes 50*b* on the integrated circuit chip 50 are connected to the intermediate terminal portion 12*c* via fine metal wires 52. The integrated circuit chip 50 equipped with peripheral circuits and other circuits and the optical element chip 5 are combined into one package.

10 Claims, 7 Drawing Sheets

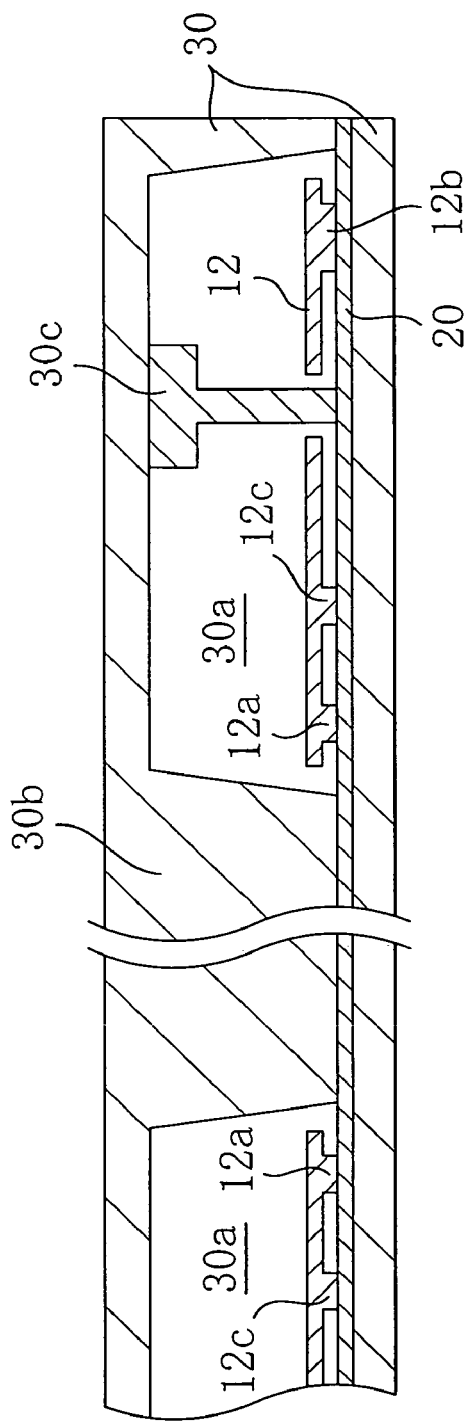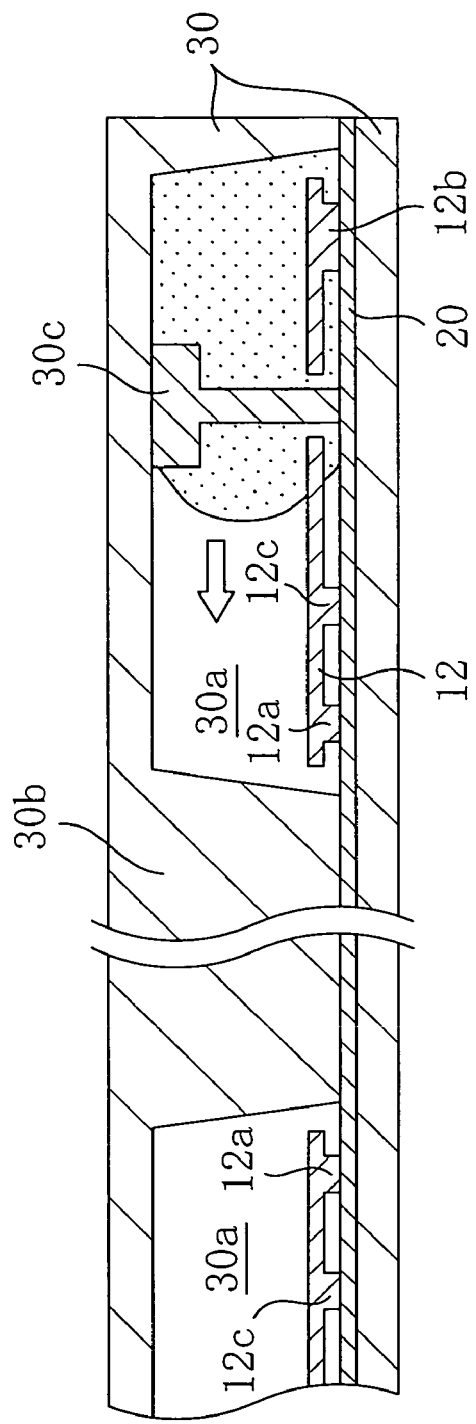
FIG. 3A
FIG. 3B

PRIOR ART

OPTICAL DEVICE AND METHOD FOR FABRICATING THE SAME

CROSS-REFERENCE TO RELATED APPLICATION

The disclosure of Japanese Patent Application No. 2004-130301 filed on Apr. 26, 2004 including specification, drawings and claims is incorporated herein by reference in its entirety.

BACKGROUND OF THE INVENTION

The present invention relates to optical devices such as solid-state imaging devices, photo-receivers for use in optical pickup systems and hologram units, and also relates to methods for fabricating the devices.

In recent years, optical devices incorporated in video cameras, digital cameras, digital still cameras and others are provided in the form of packages in which imaging devices such as CCDs are mounted on adapters such as bases made of insulating materials and light-receiving regions are covered with transparent boards.

To reduce the size of optical devices, imaging devices are mounted as bare chips on adapters such as bases (see, for example, Japanese Unexamined Patent Publication (Kokai) No. 2000-58805.)

FIG. 7 is a cross-sectional view showing a structure of a conventional optical device. As shown in FIG. 7, the optical device is mainly made of a ceramic or a plastic resin and includes: a base 131 in the shape of a frame having an opening 132 in its center; an imaging element 135 mounted on the lower face of the base 131 and constituted by, for example, a CCD; and a transparent board 136 of glass attached to the upper face of the base 131 and facing the imaging element 135 with the opening 132 sandwiched therebetween.

A recess 133 is formed in the lower face of the base 131 along the periphery of the opening 132. An interconnect 134 made of a gold-plating layer is provided to cover a part of the base 131 extending from a region of the lower face of the base 131 near the opening 132 to the outer side of the base 131. The imaging element 135 is attached to a portion of the lower face of the base 131 at the periphery of the recess 133, and have its light-receiving region 135a exposed to the opening 132.

Pad electrodes (not shown) for signal transmission between the imaging element 135 and external equipment are provided on the upper face of the imaging element 135 near the outer periphery thereof. An inner terminal portion is formed at the end of the interconnect 134 adjacent to the opening 132. The inner terminal portion of the interconnect 134 and the pad electrodes are electrically connected to each other with bumps 138. The imaging element 135, the interconnect 134 and the bumps 138 are sealed with a sealing resin 137 covering the periphery of the imaging element 135 on the lower face of the base 131.

As described above, the light-receiving region 135a of the imaging element 135 is located in a confined space formed in the opening 132. As shown in FIG. 7, this optical device is mounted on a circuit board with the transparent board 136 facing upward. An outer terminal portion is formed in a part of the interconnect 134 extending off the recess 133 and located on the lower face of the base 131. This outer terminal portion is used to establish connection to an electrode on the circuit board.

Though not shown in FIG. 7, a barrel including an imaging optical system is placed above the transparent board 136. The positional relationship between the barrel and the light-receiving region 135a is defined to have its required accuracy within a given tolerance.

Light from an object whose image is to be captured is concentrated on the light-receiving region 135a of the imaging element 135 through the imaging optical system incorporated in the barrel and is subjected to photoelectric conversion by the imaging element 135.

Unlike the structure of the base 131 shown in FIG. 7, another optical device using a base having a flat board shape as a whole, i.e., a base in which the recess 133 is not formed in the face on which the imaging element 135 is mounted, is also known (see, for example, Japanese Unexamined Patent Publication (Kokai) No. 2002-43554.) In this device, an outer terminal portion located at the outer periphery of the base extending off the edge of an opening in the base is connected to an electrode on a circuit board via, for example, solder balls with large diameters. The distance between the lower face of an imaging element and the upper face of the circuit board is adjusted using these solid balls.

The solid-state imaging device with such a structure has a small height as a package and has a small footprint. Therefore, this device is suitable for high-density packaging.

Structures basically similar to the foregoing structures are adopted in other optical devices, e.g., photo-receivers for use in optical pickup systems for performing, for example, writing, reading and rewriting of information on recording media such as DVDs, CDs and MDs and hologram units in each of which a plurality of elements in an optical pickup are integrated.

However, the structure of the conventional optical device shown in FIG. 7 does not exhibit a sufficient integration density as a whole system such as a solid-state imaging device or an optical pickup, and thus is susceptible to improvement.

SUMMARY OF THE INVENTION

It is therefore an object of the present invention to provide a highly-integrated optical device and a method for fabricating the device.

In the optical device according to the present invention, an optical element chip is mounted on a base with the principal surface of the optical element chip facing an opening in the base, a transparent member is attached to the base to face the optical element chip with the opening sandwiched therebetween, and an integrated circuit chip including a semiconductor element is mounted on the back surface of the optical element chip.

In this manner, the optical element chip and the integrated circuit chip including peripheral circuits are combined into one package, thus implementing an optical device with a high integration density. In addition, an entire system in which the optical device is incorporated is downsized and fabrication cost is reduced.

The optical element chip is flip-chip bonded to a terminal portion of an interconnect. This further reduces the size of the optical device.

The integrated circuit chip is placed in such a manner that the principal surface of the integrated circuit chip is at the side opposite the transparent member, and the semiconductor element is connected to the terminal portion of the interconnect via fine metal wires. Then, the optical device is fabricated easily.

A step portion is preferably formed in the lower face of the base to surround the opening such that the thickness of the base is reduced in a portion surrounding the opening, and the optical element chip is preferably mounted on the portion of the base where the thickness of the base is reduced.

The base is preferably provided with positioning means such as a through hole for use as a reference point in positioning a member on the base.

In a method for fabricating an optical device according to the present invention, a lead frame having an interconnect pattern is molded, an optical element chip and an integrated circuit chip are mounted in this order on optical device regions each surrounding an opening, a gap between each chip and a base is sealed, a transparent member is attached to the base to face the optical element chip with the opening sandwiched therebetween, and then a gap between the transparent member and the base is sealed.

With this method, an optical device with a high integration density in which an optical element chip and an integrated circuit chip are stacked is easily formed.

BRIEF DESCRIPTION OF THE DRAWINGS

FIGS. 3A and 3B are cross-sectional views showing a molding step in the process steps for fabricating the optical device of the first embodiment.

DESCRIPTION OF THE PREFERRED EMBODIMENTS

Embodiment 1

(Structure of Optical Device)

Figure 1A:
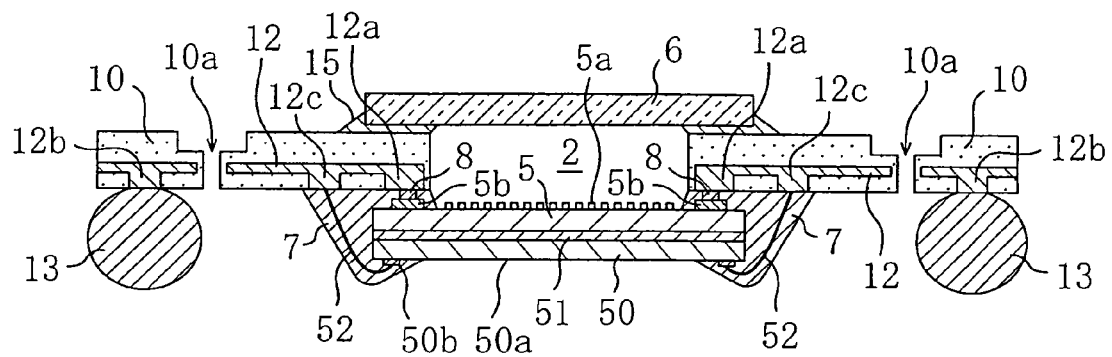
FIGS. 1A and 1B are a cross-sectional view and a backside view, respectively, taken along line IA-IA in an optical device according to a first embodiment of the present invention.
Figure 1B:
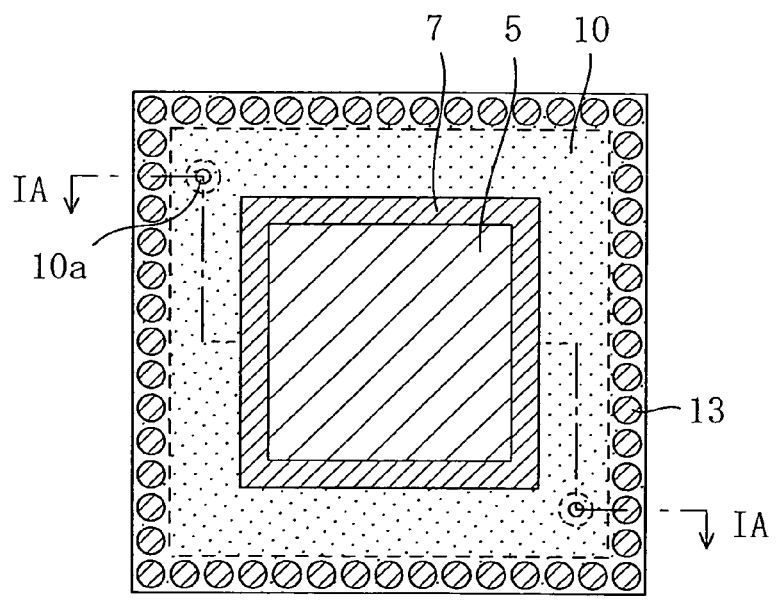

FIGS. 1A and 1B are a cross-sectional view and a backside view, respectively, taken along line IA-IA in an optical device according to a first embodiment of the present invention. It should be noted that FIGS. 1A and 1B are made on different scales.

As shown in FIGS. 1A and 1B, the optical device of this embodiment includes: a base 10 which is in the shape of a frame having an opening 2 in its center and is made of a plastic resin such as an epoxy resin; an optical element chip 5 attached to the lower face of the base 10; an integrated circuit chip 50 bonded to the back surface of the optical element chip 5 with an insulator layer 51 of an adhesive interposed therebetween; a window member 6, which is a transparent member made of glass and attached to the upper face of the base 10 and facing the optical element chip 5 with the opening 2 sandwiched therebetween; and solder balls 13. The base 10 is a member connecting the optical element chip of the optical device and the transparent member to each other. This structure is formed through procedures in which the optical element chip is mounted on the base before molding is performed. Therefore, the structure is a so-called premolded structure.

In this embodiment, the optical element chip 5 includes a solid-state imaging element such as a CCD. The optical device is a solid-state imaging device for use in video cameras, digital cameras, digital still cameras and others.

The optical element chip may be a chip on which a plurality of photo-receivers are discretely placed instead of the solid-state imaging element or a chip on which only a light-emitting element is mounted. In such a case, the optical device is either a photo-receiver placed in an optical pickup for use in a system equipped with, for example, a DVD, a CD or an MD or a light-emitting device.

An integrated circuit is mounted on the integrated circuit chip 50. The integrated circuit includes peripheral circuits such as a driver for the optical element chip 5, logic circuits, a front-end circuit and a timing generator, and a memory.

An interconnect 12 is buried in the base 10. One end of the interconnect 12 is exposed from the molding resin constituting the base 10 in a region of the lower face of the base 10 near the opening 2 to serve as an inner terminal portion 12a. The other end of the interconnect 12 is exposed from the molding resin constituting the base 10 at the outer periphery of the lower face of the base 10 to serve as an outer terminal portion 12b. The interconnect 12 also includes an intermediate terminal portion 12c exposed from the molding resin and located at the outside of the inner terminal portion 12a. Another interconnect (not shown) includes an intermediate terminal portion 12c substituting an inner terminal portion 12a. Two positioning holes 10a serving as reference points in positioning the center of the optical device in the X and Y directions are formed in the base 10. The positioning holes 10a are referred to when a chip is mounted in a fabrication process described below and when a barrel housing an optical system such as a lens is attached. At least two positioning holes 10a are enough to know the center of the optical device, and thus are sufficiently effective in positioning. Alternatively, the positioning holes 10a may be replaced with a positioning step portion formed in the outer periphery of the base 10. In such a case, the positioning step portion has the same function. Basic advantages of the present invention are obtained even if positioning means such as positioning holes or a positioning step portion is not formed.

The optical element chip 5 is mounted on a region of the lower face of the base 10 surrounding the opening 2 with its principal surface 5a on which a light-receiving region is provided exposed to the opening 2. Pad electrodes 5b for signal transmission between the optical element chip 5 and external equipment are provided near the outer periphery of the principal surface 5a of the optical element chip 5. The inner terminal portion 12a of the interconnect 12 and the pad electrodes 5b on the optical element chip 5 are electrically connected to each other via bumps 8.

The integrated circuit chip 50 is bonded to the back surface of the optical element chip 5 with its principal surface 50a on which semiconductor devices such as transistors constituting an integration circuit facing downward. Pad electrodes 50b for signal transmission between the integrated circuit chip 50 and the optical element chip 5 or external equipment are provided on the principal surface 50a of the integrated circuit chip 50 near the outer periphery thereof. The intermediate terminal portion 12c of the interconnect 12 and the pad electrodes 50b are electrically connected to each other by fine metal wires 52.

In the interconnect 12, the inner terminal portion 12a and the outer terminal portion 12b are connected, the inner terminal portion 12a and the intermediate terminal portion 12c are connected, the intermediate terminal portion 12c and the outer terminal portion 12b are connected, and the inner terminal portion 12a, the intermediate terminal portion 12c and the outer terminal portion 12b are connected. In FIG. 1A, the interconnect 12 in which the inner terminal portion 12a, the outer terminal portion 12b and the intermediate terminal portion 12c are connected is shown. The interconnect 12 makes detours around the positioning holes 10a.

The optical element chip 5, the integrated circuit chip 50, the interconnect 12, the fine metal wires 52 and the bumps 8 are sealed with a sealing resin 7 provided on the lower face of the base 10 and covering the peripheries of the optical element chip 5 and the integrated circuit chip 50. On the other hand, on the upper face of the base 10, the gap between the base 10 and the window member 6 is filled with a sealing resin 15 provided on the periphery of the window member 6. An internal space (the opening 2) is sealed with the sealing resins 7 and 15, thereby forming a package.

In this embodiment, the thickness of the entire package is 1.5 mm or less, for example. The integrated circuit chip 50 has a length of 0.5 mm to 10 mm, a width of 0.5 mm to 10 mm and a thickness of 0.05 mm to 0.3 mm. The optical element chip 5 has a length of 0.5 mm to 10 mm, a width of 0.5 mm to 10 mm, and a thickness of 0.05 mm to 0.5 mm. The size of the integrated circuit chip 50 may be almost the same as that of the optical element chip 5, or may be larger or smaller than that of the optical element chip 5.

This is because the integrated circuit chip 50 can be mounted on the optical element chip 5 in either case. In the optical device of this embodiment, the optical element chip 5 and the integrated circuit chip 50 equipped with an integrated circuit are combined into one package, i.e., a so-called a system in package (SIP) is implemented. Specifically, a solid-state imaging element, a photo-receiver, a light-emitting device and an integrated circuit for controlling these devices are incorporated in one package. Accordingly, an optical device with a high integration density is implemented. In addition, the entire system of, for example, a camera in which the optical device is incorporated is downsized and fabrication cost is reduced.

(Process for Fabricating Optical Device)

FIG. 2A through 2G are cross-sectional views respectively showing process steps for fabricating the optical device of the first embodiment. In FIGS. 2A through 2G, only one optical device region is shown. However, in reality, the device is fabricated using a lead frame in which a large number of optical device regions are arranged in a lattice pattern.

FIGS. 3A and 3B are cross-sectional views showing a molding step in the process steps for fabricating the optical device of this embodiment.

Figure 2A:
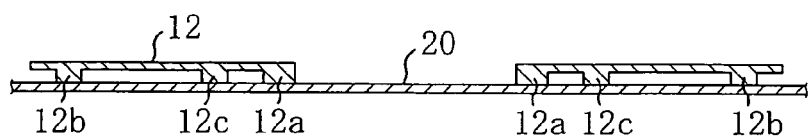
FIGS. 2A through 2G are cross-sectional views showing respective process steps for fabricating the optical device of the first embodiment.

First, in a step shown in FIG. 2A, a lead frame 12 having an interconnect pattern is placed on a sealing tape 20. A recess is formed in a large part of the lead frame 12 by pressing or half-etching, so that only portions of the lead frame 12 to be an inner terminal portion 12a, an outer terminal portion 12b and an intermediate terminal portion 12c, respectively, project downward from the bottom of the recess.

Figure 2B:
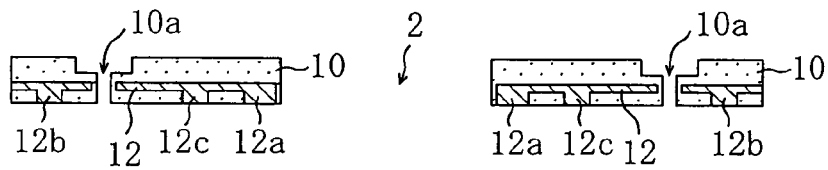

Next, in a step shown in FIG. 2B, a molding step is performed. Specifically, as shown in FIGS. 3A and 3B, the lead frame (interconnect 12) and the sealing tape 20 attached to the lead frame are placed in a molding die 30. Then, die cavities 30a in the molding die 30 are filled with a plastic resin (a molding resin) such as an epoxy resin, so that the part of the lead frame (interconnect 12) except for the inner terminal portion 12a, the outer terminal portion 12b and the intermediate terminal portion 12c is buried in the molding resin, thereby forming a base 10. At this time, pin members 30c for forming positioning holes 10a for positioning optical devices are provided in the molding die 30. A partition portion 30b for separating the die cavities 30a from each other and the pin members 30c in the molding die 30 are not filled with the molding resin. Accordingly, an opening 2 in which an optical element is to be placed and positioning holes 10a are formed in each optical device region of the base 10. At this time, a mold made of the lead frame (interconnect 12) and the base 10 and including a large number of optical device regions is formed.

Figure 2C:
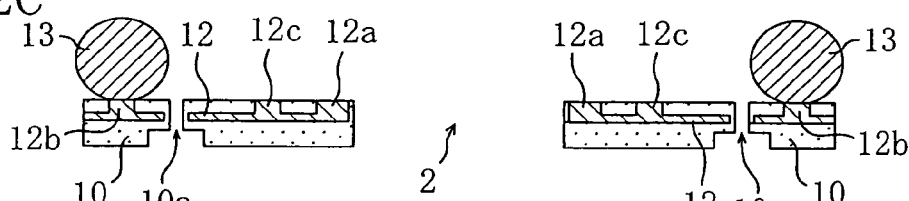

Then, in a step shown in FIG. 2C, the sealing tape 20 is removed from the mold. Thereafter, the mold is placed with its surface from which the inner terminal portion 12a, the outer terminal portion 12b and the intermediate terminal portion 12c are exposed facing upward, and solder balls 13 are formed on the outer terminal portion 12b.

Subsequently, though not shown, the mold is cut with a blade along the boundary between adjacent optical device regions at the center of a notch, thereby dividing the mold into individual optical devices.

Figure 2D:
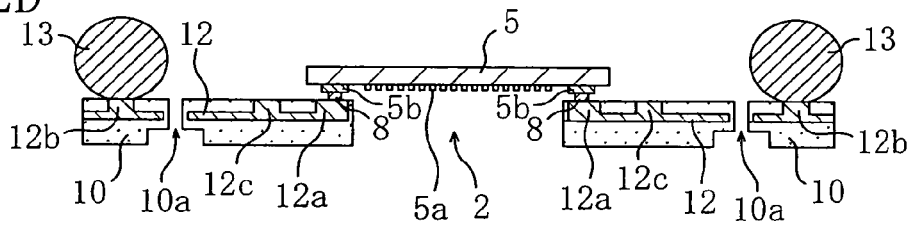

Thereafter, in a step shown in FIG. 2D, an optical element chip 5 is mounted on the base 10 with its principal surface 5a facing downward. In this case, pad electrodes 5b on the optical element chip 5 are connected to bumps 8 provided on the inner terminal portion 12a in the base 10, thereby performing flip-chip bonding. In this bonding, the optical element chip 5 is positioned with reference to the positioning holes 10a.

Figure 2E:
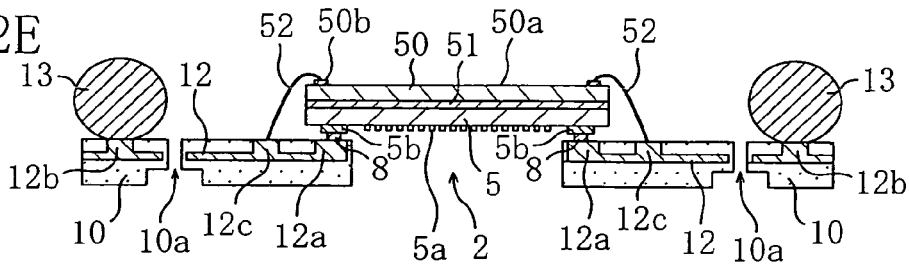

Then, in a step shown in FIG. 2E, the back surface of the optical element chip 5 is coated with an adhesive, and an integrated circuit chip 50 is mounted on the adhesive with its principal surface 50a facing upward. Pad electrodes 50b on the integrated circuit chip 50 and the intermediate terminal portion 12c of the interconnect 12 are connected to each other by fine metal wires 52. In this case, wire-bonding can be performed with the pad electrodes 50b on the integrated circuit chip 50 positioned with reference to the positioning holes 10a.

Subsequently, in a step shown in FIG. 2F, the base 10, the peripheries of the optical element chip 5 and the integrated circuit chip 50, the inner terminal portion 12a and the intermediate terminal portion 12c of the lead frame 12, the fine metal wires 52, the bumps 8, and the pad electrodes 5b and 50b are covered with a sealing resin 7 and gaps between those components are filled with the sealing resin 7.

Figure 2F:
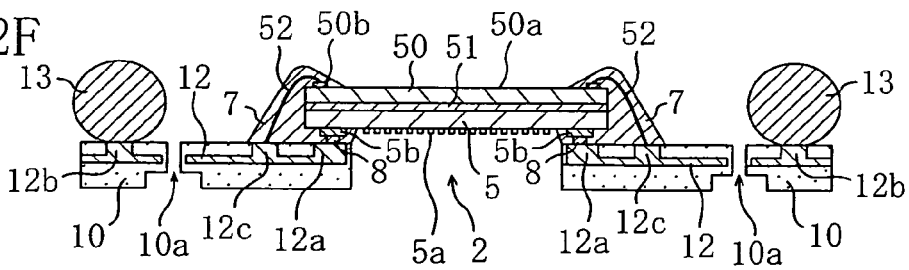
Figure 2G:
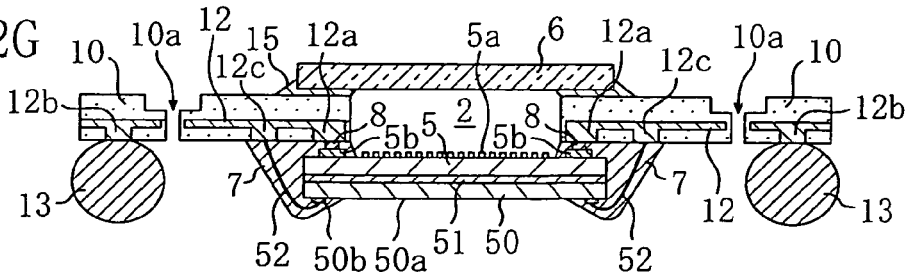

Then, in a step shown in FIG. 2G, a window member 6 made of glass is placed on the upper face of the base 10 to cover the opening 2 with the face of the base 10 on which the optical element chip 5 and the integrated circuit chip 50 are mounted (i.e., the lower face of the base 10) facing downward. Then, the gap between the window member 6 and the base 10 is filled with a sealing resin 15, thereby sealing the opening 2.

With the fabrication method according to this embodiment, the pad electrodes 5b on the optical element chip 5 and the inner terminal portion 12a of the interconnect 12 are connected to each other via the bumps 8. The integrated circuit chip 50 is bonded to the back surface of the optical element chip 5 with its principal surface 50a facing downward. In other words, the back surfaces of the integrated circuit chip 50 and the optical element chip 5 are bonded together with the insulator layer 51 sandwiched therebetween. In this manner, an optical device with a high integration density is implemented.

Through holes filled with a conductor member may be formed in the optical element chip 5 so that the pad electrodes 50b on the integrated circuit chip 50 and the pad electrodes 5b on the optical element chip 5 are electrically connected to each other via the through holes. In this case, the fine metal wires 52 are unnecessary.

In particular, in the step shown in FIG. 2D, the optical element chip 5 is positioned with reference to the positioning holes 1a formed in the base 10. Then, in the step shown in FIG. 2E, the positions of the pad electrodes 50b on the integrated circuit chip 50 are determined. Accordingly, positioning accuracy for the optical axis of the optical element chip 5 and symmetry accuracy for the length of each fine metal wire during wire-bonding to the integrated circuit chip 50 are enhanced. As already described above, after formation of the optical device, the positioning holes 10a can be used to locate a barrel including an optical system (i.e., to set the optical axis). Accordingly, accuracy in so-called tilt/swing (i.e., two- or three-dimensional movement of the optical axis) as an entire optical device and positioning accuracy are enhanced. As described above, instead of the positioning holes 10a, a positioning step portion may be formed in the periphery of the base 10. Then, same advantages are obtained. In particular, if through holes are provided, these through holes are suitable as reference points for positioning the integrated circuit chip 50.

The cutting step may be performed after the step of mounting the optical element chip shown in FIG. 2F or after the step of placing the window member 6 shown in FIG. 2G.

In the fabrication process of this embodiment, the molding step is performed with the lead frame placed on the sealing tape. However, this sealing tape is not necessarily used. It should be noted that if the sealing tape is used, the upper and lower faces of the lead frame are clamped with an upper molding die and a lower molding die, so that the mold faces are in contact with the upper and lower faces of the lead frame with stability. As a result, occurrence of resin fins due to molding is effectively suppressed and, in addition, the outer terminal portion projects from the molding resin. Accordingly, packaging is performed easily, e.g., solder joint in attaching an optical device to a mother board is performed easily, and the speed in packaging is increased.

Embodiment 2

Figure 4A:
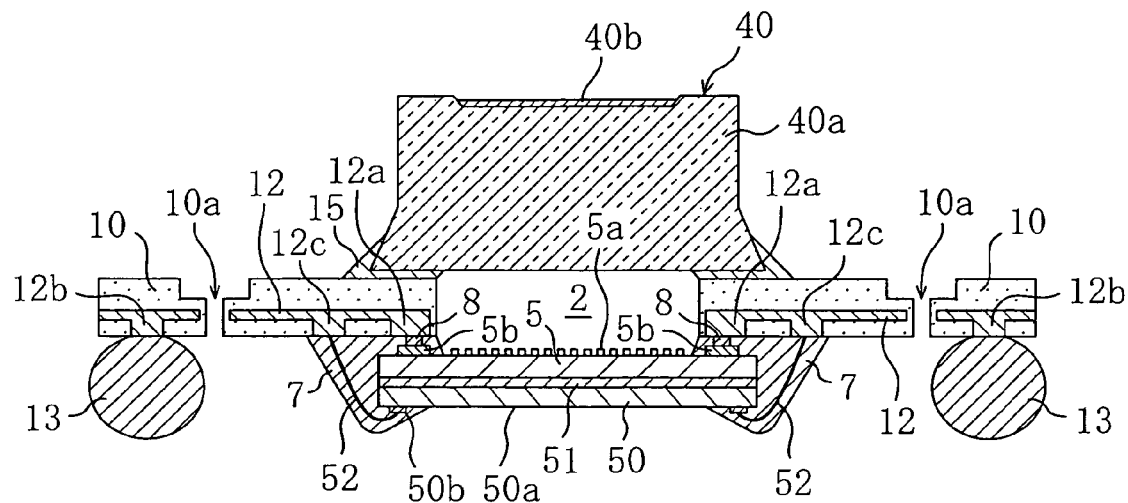
FIGS. 4A and 4B are a cross-sectional view and a backside view, respectively, taken along line IVA-IVA in an optical device according to a second embodiment of the present invention.
Figure 4B:
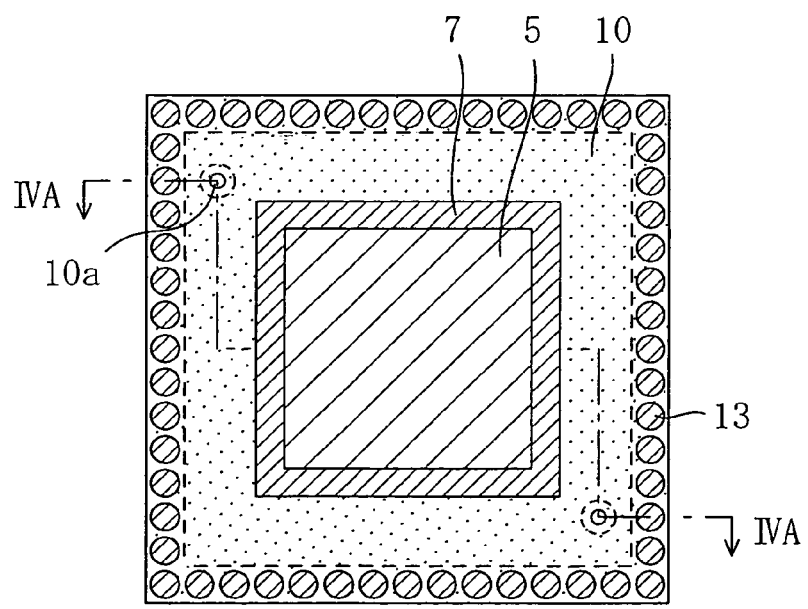

FIGS. 4A and 4B are a cross-sectional view and a backside view, respectively, taken along line IVA-IVA in an optical device according to a second embodiment of the present invention. It should be noted that FIGS. 4A and 4B are made on different scales.

As shown in FIGS. 4A and 4B, the optical device of this embodiment includes: a base 10 which is in the shape of a frame having an opening 2 in its center and is made of a plastic resin such as an epoxy resin; an optical element chip 5 attached to the lower face of the base 10; an integrated circuit chip 50 bonded to the back surface of the optical element chip 5 with an insulator layer 51 of an adhesive interposed therebetween; a hologram 40, which is a transparent member of, for example, an optical resin attached to the upper face of the base 10 and facing the optical element chip 5 with the opening 2 sandwiched therebetween; and solder balls 13. The base 10 is a member connecting the optical element chip of the optical device and the hologram to each other. This structure is formed through procedures in which the optical element chip is mounted on the base before molding is performed. Therefore, the structure is a so-called premolded structure.

In this embodiment, the optical element chip 5 includes a light-emitting element 5c. i.e., a light-emitting diode, and a photo-receiving element 5d. The optical device is a hologram unit in which a plurality of elements in an optical pickup for use in a system equipped with a DVD, a CD or an MD, for example, are incorporated.

An integrated circuit is mounted on the integrated circuit chip 50. The integrated circuit includes peripheral circuits such as a driver for the optical element chip 5, logic circuits, a front-end circuit and a timing generator and a memory.

The hologram 40 includes a body portion 40a made of a transparent material such as an optical resin and a hologram region 40b in the upper face of the body portion 40a. The external periphery and the lower face of the body portion 40a of the hologram 40 are fixed onto the upper face of the base 10 with an adhesive 15. The gap between the hologram 40 and the base 10 is filled with the adhesive 15.

The height of the hologram 40 is in the range from 0.5 mm to 5 mm, for example. The thickness of the entire package is 3 mm or less, for example. The size of the insulator layer 51 is the same as that in the first embodiment. The optical element chip 5 has a length of 0.5 mm to 10 mm, a width of 0.5 mm to 10 mm, and a thickness of 0.05 mm to 0.5 mm.

An interconnect 12 is buried in the base 10. One end of the interconnect 12 is exposed from the molding resin constituting the base 10 in a region of the lower face of the base 10 near the opening 2 to serve as an inner terminal portion 12a. The other end of the interconnect 12 is exposed from the molding resin constituting the base 10 at the outer periphery of the lower face of the base 10 to serve as an outer terminal portion 12b. The interconnect 12 also includes an intermediate terminal portion 12c exposed from the molding resin and located at the outside of the inner terminal portion 12a. Another interconnect (not shown) includes an intermediate terminal portion 12c substituting an inner terminal portion 12a. Two positioning holes 10a serving as reference points in positioning the center of the optical device in the X and Y directions are formed in the base 10. The positioning holes 10a are referred to when a chip is mounted in a fabrication process described below and when a hologram is attached. At least two positioning holes 10a are enough to know the center of the optical device, and thus are sufficiently effective in positioning. Alternatively, the positioning holes 10a may be replaced with a positioning step portion formed in the outer periphery of the base 10 so that the hologram is fit into the positioning step portion. In such a case, the same function is achieved. Basic advantages of the present invention are obtained even if positioning means such as positioning holes or a positioning step portion is not formed.

The optical element chip 5 is mounted on a region of the lower face of the base 10 surrounding the opening 2 with its principal surface 5a on which a light-receiving region is provided exposed to the opening 2. Pad electrodes 5b for signal transmission between the optical element chip 5 and external equipment are provided near the outer periphery of the principal surface 5a of the optical element chip 5. The inner terminal portion 12a of the interconnect 12 and the pad electrodes 5b on the optical element chip 5 are electrically connected to each other via bumps 8.

The integrated circuit chip 50 is bonded to the back surface of the optical element chip 5 with its principal surface 50a on which semiconductor devices such as transistors constituting an integration circuit are formed facing downward. Pad electrodes 50b for signal transmission between the integrated circuit chip 50 and the optical element chip 5 or external equipment are provided on the principal surface 50a of the integrated circuit chip 50 near the outer periphery thereof.

The intermediate terminal portion 12c of the interconnect 12 and the pad electrodes 50b are electrically connected to each other by fine metal wires 52.

In the interconnect 12, the inner terminal portion 12a and the outer terminal portion 12b are connected, the inner terminal portion 12a and the intermediate terminal portion 12b are connected, the intermediate terminal portion 12a and the outer terminal portion 12b are connected, and the inner terminal portion 12a, the intermediate terminal portion 12b and the outer terminal portion 12b are connected. In FIG. 4A, the interconnect 12 in which the inner terminal portion 12a, the intermediate terminal portion 12c and the outer terminal portion 12b are connected is shown. The interconnect 12 makes detours around the positioning holes 10a.

The optical element chip 5, the integrated circuit chip 50, the interconnect 12, the fine metal wires 52 and the bumps 8 are sealed with a sealing resin 7 provided on the lower face of the base 10 and covering the peripheries of the optical element chip 5 and the integrated circuit chip 50. An internal space (the opening 2) is sealed with the sealing resins 7 and 15, thereby forming a package. At this time, for smooth mounting of the solder balls 13 on a mother board by reflowing, the lower edge of the sealing resin 7 is located above the lower edges of the solder balls 13.

In the optical device of this embodiment, the optical element chip 5, the integrated circuit chip 50 on which an integrated circuit is mounted, and the hologram 40 are combined into one package, i.e., a so-called system in package (SIP) is implemented. Specifically, a light-emitting element, a photo-receiver, an integrated circuit for controlling these devices, a hologram and others are incorporated in one package. Accordingly, an optical device (a hologram unit) with a high integration density is implemented. In addition, the entire system in which a hologram unit is incorporated is downsized and fabrication cost is reduced.

Figure 7:
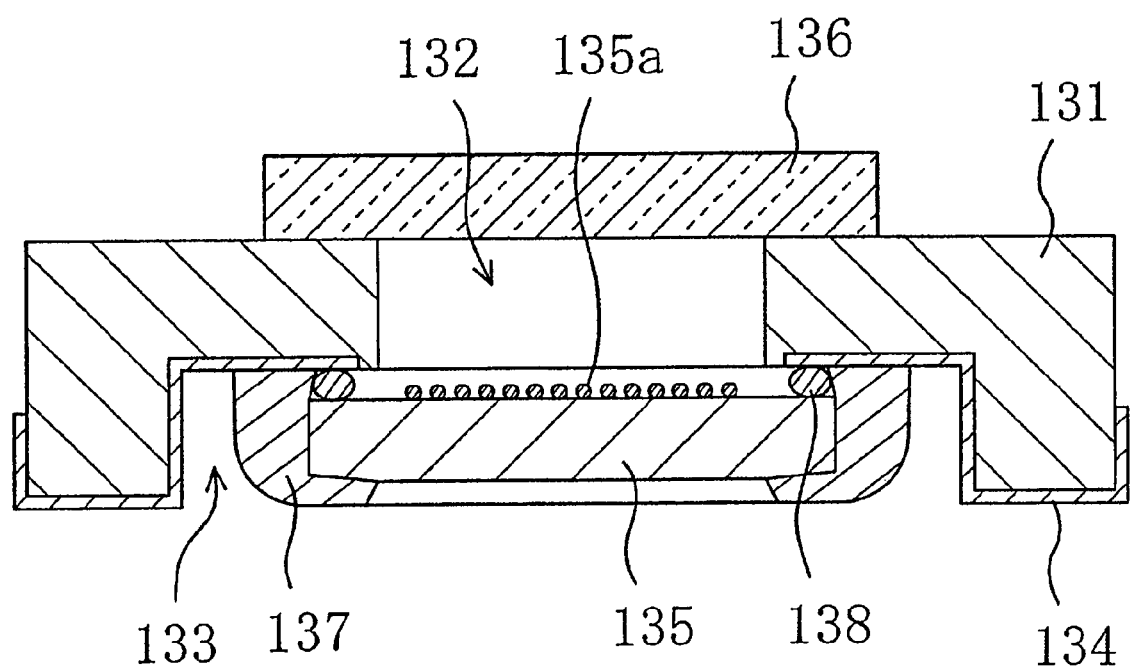
FIG. 7 is a cross-sectional view showing a structure of a conventional optical device.

Instead of the base 10 of this embodiment, the structure in which an integrated circuit chip, fine metal wires and others are buried in the base 131 having the recess shown in FIG. 7 may be adopted. In such a case, advantages obtained by incorporating an optical element chip and an integrated circuit chip including peripheral circuits into one package are obtained.

The process steps for fabricating the optical device of this embodiment are not shown. If the hologram 40 is attached to the base 10 instead of the window member 6 in the step shown in FIG. 2G in the first embodiment, the structure shown in FIGS. 4A and 4B are easily obtained. In the attachment of the hologram, the hologram region 40b of the hologram 40 is positioned with reference to the positioning holes 10a.

Accordingly, in the fabrication process steps of this embodiment, positioning in the attachment of the optical element chip 5, the integrated circuit chip 50 and the hologram 40 is performed with reference to the positioning holes 10a. As a result, the same advantages as those in the fabrication method of the first embodiment are obtained and, in addition, a hologram unit exhibiting excellent X/Y accuracy is implemented.

Embodiment 3

(Structure of Optical Device)

Figure 5A:
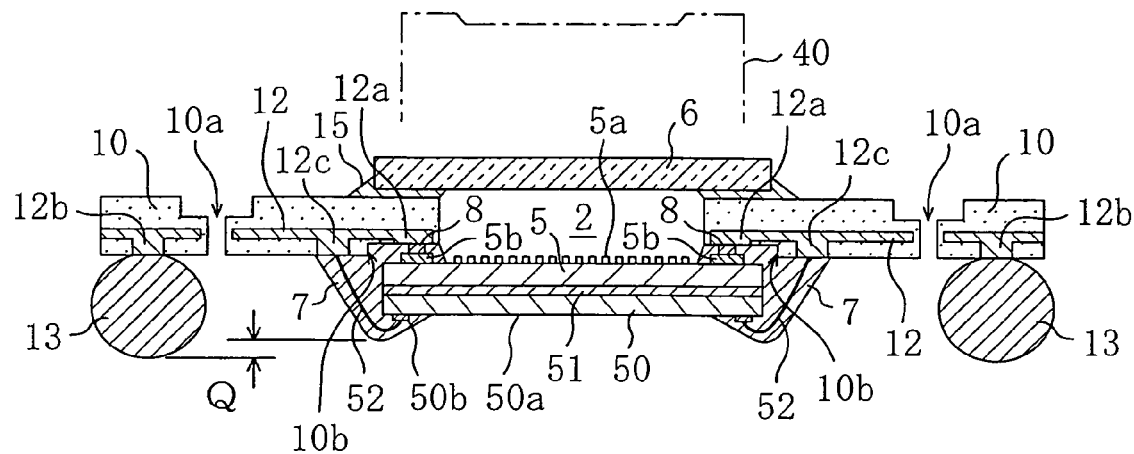
FIGS. 5A and 5B are a cross-sectional view and a backside view, respectively, taken along line VA-VA in an optical device according to a third embodiment of the present invention.
Figure 5B:
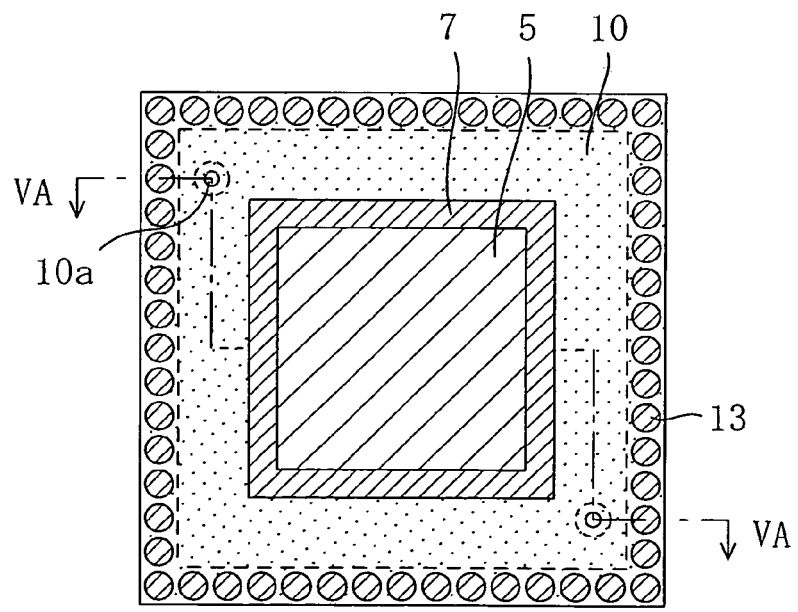

FIGS. 5A and 5B are a cross-sectional view and a backside view, respectively, taken along line VA-VA in an optical device according to a third embodiment of the present invention. It should be noted that FIGS. 5A and 5B are made on different scales.

As shown in FIGS. 5A and 5B, in the optical device of this embodiment, coining is performed on an inner terminal portion 12a of an interconnect 12, so that a step portion 10b is formed in the lower face of a base 10 to surround an opening 2. That is, the thickness of the base 10 is reduced in a portion surrounding the opening 2. Accordingly, an optical element chip 5 and an integrated circuit chip 50 are placed closer to a window member 6 than in the first embodiment. In other words, the distance from the optical element chip 5 and the integrated circuit chip 50 to the window member 6 is reduced. The other part of the structure is the same as that described in the first embodiment with reference to FIGS. 1A and 1B.

In this embodiment, the same advantages as in the first embodiment are obtained. In addition, the optical element chip 5 and the integrated circuit chip 50 are closer to the window member 6, so that the following advantages are obtained.

First, the distance between the lowest face of a sealing resin 7 and the lowest faces of solder balls 13, i.e., the clearance Q, is sufficiently large. Accordingly, when the optical device is mounted on a mother board, the reliability of connection to wiring on the mother board via the solder balls 13 is enhanced. This allows reduction of the diameter of the solder balls 13, so that the height of the entire optical device is reduced.

Second, the distance between pad electrodes 50b on the integrated circuit chip 50 and an intermediate terminal portion 12c of the interconnect 12 decreases, so that the loop height required of fine metal wires 52 is reduced. Accordingly, wire bonding is performed with higher accuracy.

Third, the distance between the lower face of a window member 6 and the upper face of the optical element chip 5 is reduced, so that a lens provided above the window member 6 can be moved in a wide range to adjust the focal length of the lens. Accordingly, flexibility in designing a system in which the optical device is used is enhanced.

In this embodiment, a chip on which a light-emitting element such as a light-emitting diode and a photo-receiver are mounted may be used as the optical element chip 5, and the window member 6 may be replaced with a hologram (see the dash-dotted line in FIG. 5A) as a transparent member. In this case, the optical device is a hologram unit in which a plurality of elements in an optical pickup for use in a system equipped with a DVD, a CD or an MD, for example, are incorporated. In this case, positioning holes 10a (or a positioning step portion) are also formed in the base 10, thus enhancing the accuracy in positioning the hologram.

(Process for Fabricating Optical Device)

FIG. 6A through 6H are cross-sectional views respectively showing process steps for fabricating the optical device of the third embodiment. In FIGS. 6A through 6H, only one optical device region is shown. However, in reality, the device is fabricated using a lead frame in which a large number of optical device regions are arranged in a lattice pattern.

Figure 6A:
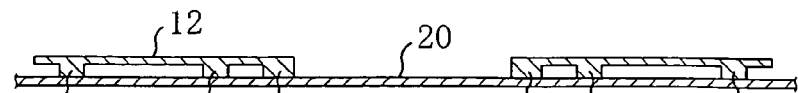
FIGS. 6A through 6H are cross-sectional views showing respective process steps for fabricating the optical device of the third embodiment.

First, in a step shown in FIG. 6A, a lead frame 12 having an interconnect pattern is placed on a sealing tape 20. A recess is formed in a large part of the lead frame 12 by pressing or half-etching, so that only portions of the lead frame 12 to be an inner terminal portion 12a, an outer terminal portion 12b and an intermediate terminal portion 12c, respectively, project downward from the bottom of the recess.

Figure 6B:
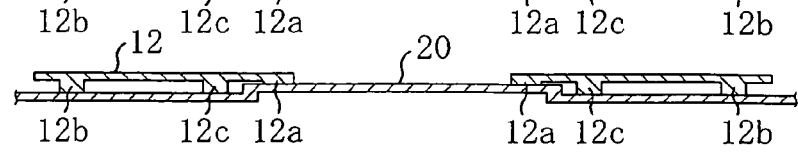

Next, in a step shown in FIG. 6B, coining is performed on the inner terminal portion 12a of the lead frame 12 with the lead frame 12 kept in contact with the sealing tape 20, thereby reducing the thickness of the inner terminal portion 12a.

Figure 6C:
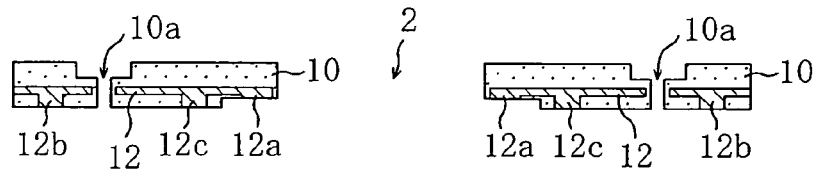
Figure 6D:
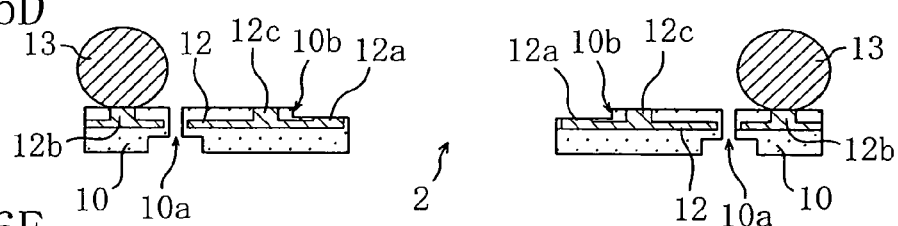
Figure 6E:
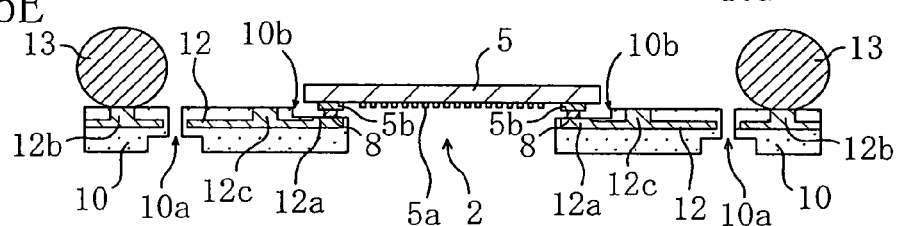
Figure 6F:
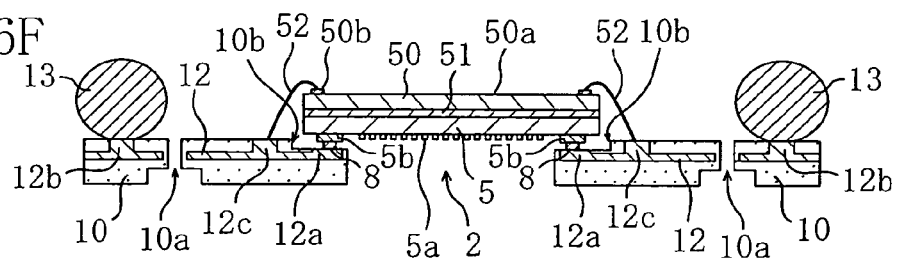
Figure 6G:
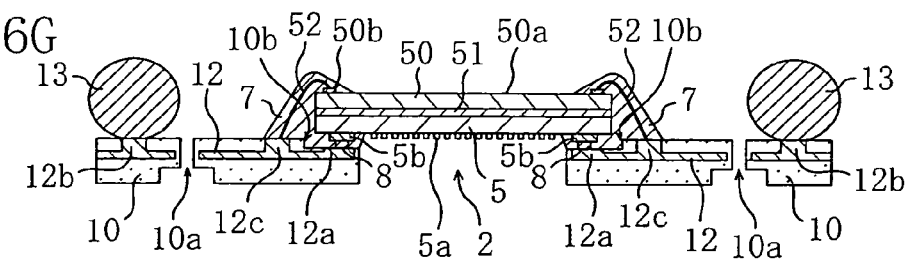
Figure 6H:
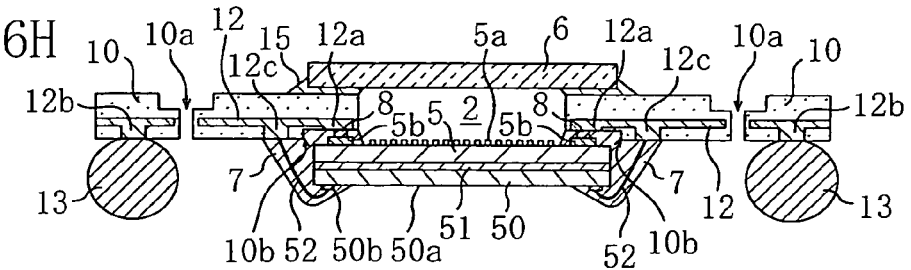

Then, in a step shown in FIG. 6C, a molding step is performed. Specifically, as shown in FIGS. 3A and 3B in the first embodiment, the lead frame (interconnect 12) and the sealing tape 20 attached to the lead frame are placed in a molding die 30. Then, die cavities 30a in the molding die 30 are filled with a plastic resin (a molding resin) such as an epoxy resin, so that the part of the lead frame (interconnect 12) except for the inner terminal portion 12a, the outer terminal portion 12b and the intermediate terminal portion 12c is buried in the molding resin, thereby forming a base 10. At this time, this embodiment is different from the first embodiment in that the lower part of the molding die 30 has a step portion corresponding to the step portion 10b shown in FIG. 5A near the inner terminal portion 12a. Accordingly, the step portion 10b is formed in a part of the base 10 near the inner terminal portion 12a.

As in the first embodiment, pin members 30c for forming positioning holes 10a for positioning optical devices are provided in the molding die 30, as shown in FIGS. 3A and 3B. A partition portion 30b for separating the die cavities 30a from each other and the pin members 30c in the molding die 30 are not filled with the molding resin. Accordingly, an opening 2 in which an optical element is to be placed, positioning holes 10a and a step portion 10b are formed in each optical device region of the base 10.

Thereafter, in steps shown in FIGS. 6D through 6H, the same steps as those described in the first embodiment with reference to FIGS. 2C through 2F are performed.

With the fabrication method according to this embodiment, the structure of the optical device shown in FIG. 5A is obtained. In particular, in the step shown in FIG. 6B, the inner terminal portion 12a of the lead frame (interconnect 12) is subjected to coining, thereby easily forming the step portion 10b for placing the optical element chip 5 and the integrated circuit chip 50 closer to the window member 6.

What is claimed is:

1. An optical device comprising:
   a base made of a molding resin and having an opening, a first face, and a second face;
   a lead frame buried in the base and having a part exposed from the base at the outer periphery of the second face of the base to serve as an outer terminal portion, a part exposed from the base in a region of the second face of the base surrounding the opening to serve as an inner terminal portion, and a part exposed from the base in a region of the second face between the outer terminal portion and the inner terminal portion to serve as an intermediate terminal portion;
   a transparent member attached to the first face of the base and covering the opening;
   a first resin member for sealing a gap between an edge of the transparent member and a portion of the first face of the base surrounding the opening;
   an optical element chip provided on the second face of the base and including an optical element electrically connected to the inner terminal portion, the optical element chip having a principal surface facing the transparent member with the opening sandwiched therebetween, the second face being at the opposite side of the first face;
   an integrated circuit chip bonded to a back surface of the optical element chip and including a semiconductor element electrically connected to the intermediate terminal portion; and
   a second resin member for sealing a gap between respective edges of the optical element chip and the integrated circuit chip and a portion of the second face of the base surrounding the opening.

2. The optical device of claim 1, wherein the optical element chip is flip-chip bonded to the inner terminal portion.

3. The optical device of claim 1, wherein the integrated circuit chip has a principal surface opposite to the surface thereof facing the transparent member, and
   the semiconductor element is connected to the inner terminal portion via at least one fine metal wire.

4. The optical device of claim 1, wherein an insulating film is interposed between the optical element chip and a back surface of the integrated circuit chip.

5. The optical device of claim 1, wherein a step portion is formed in the second face of the base to surround the opening such that the thickness of the base is reduced in a portion surrounding the opening, and
   the optical element chip is mounted on the portion of the base where the thickness of the base is reduced.

6. The optical device of claim 1, wherein the base is provided with positioning means for use as a reference point in positioning a member on the base.

7. The optical device of claim 6, wherein the positioning means is a through hole formed in the base.

8. The optical device of claim 1, wherein a solid-state imaging element is mounted on the optical element chip.

9. The optical device of claim 1, wherein either a light-emitting element or a photo-receiver is mounted on the optical element chip, and
   the optical device is incorporated in an optical pick up apparatus.

10. The optical device of claim 1, wherein the transparent member is a hologram, and
    a photo-receiver and a light-emitting element are mounted on the optical element chip.

* * * * *